United States Patent
Cramer et al.

(10) Patent No.: US 6,260,248 B1
(45) Date of Patent: Jul. 17, 2001

(54) METHOD FOR PRODUCING A MONOLITHIC MULTILAYER PIEZO ACTUATOR

(75) Inventors: Dieter Cramer, Holzkirchen; Hans Hellebrand, München; Karl Lubitz, Ottobrunn, all of (DE)

(73) Assignee: Siemens Aktiengesellschaft ( * ) Notice: Subject to any disclaimer, the term of this patent is extended or adjusted under 35 U.S.C. 154(b) by 0 days.

(21) Appl. No.: 09/171,474
(22) PCT Filed: Apr. 3, 1997
(86) PCT No.: PCT/DE97/00687
§ 371 Date: Oct. 19, 1998
§ 102(e) Date: Oct. 19, 1998
(87) PCT Pub. No.: WO97/40536
PCT Pub. Date: Oct. 30, 1997

(30) Foreign Application Priority Data

Apr. 19, 1996 (DE) ............................................. 196 15 694

(51) Int. Cl.[7] .................................................. H04R 17/00
(52) U.S. Cl. .................... 29/25.35; 29/851; 310/323.06; 310/331
(58) Field of Search ............................ 29/25.35, 25.41, 29/594, 851; 310/311, 323, 331, 323.06, 323.01, 323.03; 361/301.4, 321.1, 321.2, 321.4

(56) References Cited

U.S. PATENT DOCUMENTS

| | | | |
|---|---|---|---|
| 4,510,000 | * | 4/1985 | Kumar et al. ........................ 29/851 |
| 4,932,119 | | 6/1990 | Ealey et al. .......................... 29/25.35 |
| 5,126,618 | | 6/1992 | Takahashi et al. .................... 310/346 |
| 5,317,792 | * | 6/1994 | Tanaka ................................. 29/25.35 |
| 5,438,232 | | 8/1995 | Inoue et al. .......................... 310/328 |
| 5,440,794 | * | 8/1995 | Kaeriyama et al. ................. 29/25.35 |
| 5,607,535 | * | 3/1997 | Tsukada et al. ..................... 29/25.35 |
| 5,614,044 | * | 3/1997 | Nagayama et al. ................. 29/25.35 |
| 5,792,293 | * | 8/1998 | Inasaka ................................. 29/851 |

FOREIGN PATENT DOCUMENTS

| | | |
|---|---|---|
| 0 448 349 A2 | 9/1991 | (EP) . |
| 63-51615 | 3/1988 | (JP) . |
| 63-288074 | 11/1988 | (JP) . |
| 04264784 | 9/1992 | (JP) . |

OTHER PUBLICATIONS

Sensors and Actuators, A, 43, (1994) 357–365.
Ferroelectrics, 1983, vol. 50, pp. 181–190.

* cited by examiner

Primary Examiner—Lee Young
Assistant Examiner—A. Dexter Tugbang
(74) Attorney, Agent, or Firm—Schiff Hardin & Waite

(57) ABSTRACT

A method for manufacturing a monolithic piezoelectric actuator of multilayer design and having a high aspect ratio of more than two built up from a plurality of smaller stacks in a multilayer design, includes alternately layering green piezoceramic films and electrode material, compressing the layers while elevating the temperature to remove the binder and thereby form a composite, stacking several of the composites on one another, and sintering the stack so as to form the monolithic piezoelectric actuator which exhibits an improved mechanical strength with good piezoelectric properties.

7 Claims, 3 Drawing Sheets

METHOD FOR PRODUCING A MONOLITHIC MULTILAYER PIEZO ACTUATOR

BACKGROUND OF THE INVENTION

1. Field of the Invention

The present invention relates to a monolithic piezoelectric actuator of multilayer design which has a high aspect ratio of more than two and which is built up from a plurality of smaller stacks in a multilayer design.

Piezoelectric actuators normally include a plurality of piezoelectric elements arranged in a stack. Each of these elements, in turn, includes a piezoceramic layer which is provided on both sides with metallic electrodes. If a voltage is applied to these electrodes, the piezoceramic layer reacts with a lattice distortion which leads to a usable lengthwise expansion along a major axis. Since this amounts to less than two parts per thousand of the layer thickness along the major axis, a correspondingly higher layer thickness of active piezoceramic must be provided in order to achieve a desired absolute lengthwise expansion. With increasing layer thickness of the piezoceramic layer within one piezoelectric element, however, the voltage necessary for the response of the piezoelectric element also rises. In order to keep the voltage within manageable limits, the thicknesses of individual piezoelectric elements normally lie between 20 and 200 $\mu$m. A piezoelectric actuator must therefore have an appropriate number of individual elements or layers for a desired lengthwise expansion.

Known piezoelectric actuators of multilayer design therefore summarily include numerous individual layers. For their production, piezoceramic green films are alternatively arranged with electrode material to form a stack. The layers are then laminated and sintered together to form a monolithic composite. Such a process is known, for example, from an article by S. Takahashi et al. in Ferroelectrics, 1983, Vol. 90, pages 181 to 190. Larger actuators with larger absolute deflection are obtained, for example, by adhesively bonding a plurality of such stacks. Such a process is disclosed, for example, by U.S. Pat. No. 5,438,242. However, such bonded stacks have too low a stiffness for many applications, in particular if high forces have to be transmitted using the piezoelectric actuator. Sufficiently high stiffnesses are possessed only by piezoelectric actuators of fully monolithic multilayer design. Only the latter exhibit a sufficiently solid composite of the individual layers in the stack.

In the production of monolithic actuators of multilayer design, however, additional problems occur with increasing height. The plates which are laminated to form a stack and which contain numerous individual actuators must be divided up before sintering. Here, the stacks of the relatively large-area green films are divided up into smaller stacks with the desired actuator area. While low stacks can be stamped in automatic machines, such as is possible, for example in the case of multilayer capacitors, in the case of higher stacks this must be replaced by a multiple sawing process along the separating lines.

In the case of low stacks, the lamination can take place in automatic machines with short cycle times. Higher stacks must be laminated with increased care in order, in particular, to maintain the vertical structural accuracy during lamination. In the process there is always the risk that, as a result of the applied pressure, transverse flow processes in the green films will lead to a displacement of individual layers in relation to one another. In the zones with which contact is to be made later, the accuracy of contact is thereby destroyed.

The organic binders which are used in multilayer technology are primarily matched to the requirements of the green film production and also lamination. They also must be removed before sintering by means of a complicated binder removal process in furnaces with a monitored atmosphere. However, the diffusion paths for the binder or its decomposition products during the binder removal process are multiplied with increasing stack height. In order to prevent destruction of the stack as a result of too high an internal pressure of the decomposing binder, it is necessary to take very elaborate technical measures, much more sophisticated than those in the case of the production of multilayer capacitors.

Because of the many problems to be solved in the production of piezoelectric actuators of multilayer design, known monolithic piezoelectric actuators in the cost-effective technology which is normal in the manufacture of multilayer capacitors were until now restricted to a maximum height of about 2.5 to 5 mm. In addition, for the reasons mentioned, these known piezoelectric actuators only achieve an aspect ratio (height/width) of a maximum of about 2. Higher actuators and actuators with a higher aspect ratio were previously obtained by adhesively bonding together a plurality of smaller stacks; the stiffness of the stack and hence its mechanical loadability being reduced.

It is therefore an object of the present invention to provide a simple and reliable production process for a piezoelectric actuator of monolithic multilayer design which possesses a high aspect ratio of more than 2, which can be produced monolithically in stack heights of more than 5 mm and which possesses optimum piezoelectric properties and a high mechanical composite strength.

SUMMARY OF THE INVENTION

This object is achieved according to the present invention with a method, and apparatus according to the hereafter appended claims.

The fundamental idea of the present invention is to carry out the lamination in a blank with a limited stack height. Following the separation of the laminates, that is to say, the dividing up of the large-area laminated first stacks (=first composites) into smaller second stacks (=second composites) of the desired actuator base area, the binder removal takes place. A plurality of these second composites are then stacked up to a height which is a multiple of the first blank and then sintered under light pressure to make the piezoelectric actuator of the present invention. In this case, piezoelectric actuators according to the present invention having an overall height of more than 5 mm and an aspect ratio of more than 2 can be obtained. As a result of the lamination of the first stacks with a relatively low blank thickness and, hence, a relatively low stack height, it is possible to maintain a high vertical accuracy of the internal electrode structures. This is particularly important since the electrodes are printed in a structured way onto the green films so that cutouts remain in the electrode layers; the exact positioning of such cutouts in the stack being particularly important for the correct making of contact. This high vertical accuracy within a composite can be maintained in a simple way during the stacking on one another of a plurality of these composites and the subsequent joint sintering. Slight displacements which can occur during the stacking of the composites on one another are of no significance in this case. The dividing up of the first composites of limited stack height can be carried out in a known cost-effective way by cutting, stamping or shearing. The removal of the binder from the optionally separated composites takes place at a low stack height of, for example, up to 2 mm. This means that maximum diffusion paths of about 1 mm have to be overcome by the binder or its decomposition products. It is therefore possible to use a conventional process without additional complicated process monitoring for the binder removal.

The production of first composites with electrode structures which are unified in the composite makes it possible in a simple way to produce a piezoelectric actuator having different layer areas through the combination of a plurality of composites of different electrode structure. The layer areas may differ in this case in the exact electrode structure, the layer thicknesses of the individual layers or the making of electrical contact. It is thus possible to implement mechanically coupled, but electrically decoupled, actuator and sensor functions alongside one another in the piezoelectric actuator. The production of the end areas, that is to say the top areas and bottom areas of the piezoelectric actuators, is also simplified in this way. These areas include relatively large areas of electrically inactive ceramic layers which can be implemented with or without an electrode structure lying in between.

The piezoelectric actuator according to the present invention and its construction process is, in this case, completely independent of the materials used. Any desired PZT (lead zirconate titanate) ceramic can be used for the actuator. In order to produce the electrode layers, various pastes containing metal can be used. A paste containing platinum particles, for example, makes sintering possible at the high optimum temperature which is necessary for a good ceramic structure and, hence, for good piezoelectric properties. For lower sintering temperatures, pastes containing palladium/silver are also suitable.

Additional features and advantages of the present invention are described in, and will be apparent from, the Detailed Description of the Preferred Embodiments and the Drawings.

DETAILED DESCRIPTION OF THE PREFERRED EMBODIMENTS

With regard to the production of a piezoelectric actuator, the starting materials, which are mixed as homogeneously as possible, can be produced in accordance with known processes. They can be constituted, for example, in accordance with the mixed oxide process or via chemical routes, for example in accordance with the sol-gel process, the citrate process, the oxalate process or via other organometallic precursor compounds. Whereas for the mixed oxide process all the cations provided for the ceramic are mixed with one another in the form of their oxides and are then converted into PZT, other production processes start from mixed solutions of organometallic compounds of the desired cations. By means of precipitation from solution or by means of gradual thickening in the so-called sol-gel process, an extremely homogeneous distribution of the cations in the subsequent solid is achieved. For example, a ceramic powder of the nominal composition $Pb_{0.97}Nd_{0.02}(Zr_{0.54}Ti_{0.46})O_3$ is obtained.

Following calcining, the product is re-ground and homogenized. It is then mixed with an organic binder and water wherein a slip is thus produced. Using this, green films are then drawn or cast which, following drying, have a thickness of, for example, 20 to 200 $\mu$m.

Following drying the green films are provided with electrode material; for example, printed with a paste which contains particles of a silver/palladium alloy (70/30 mass ratio) in a binder with an overall printable consistency. However, it is also possible to use pastes with particles of other conductive metals, such as platinum.

Electrode structures for a plurality of piezoelectric elements can be simultaneously printed onto the base area of a green film in one step. In so doing, for the purpose of subsequently making contact, at least one cutout in the electrode structure is provided for each individual piezoelectric element.

Figure 1:
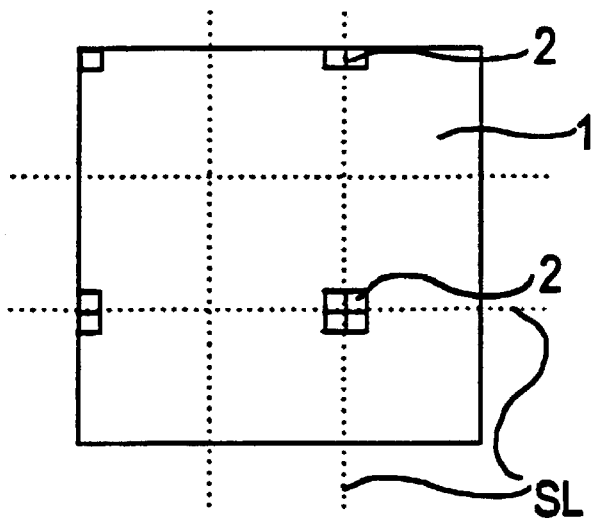
FIG. 1 shows a plan view of a green film printed with electrode material.

FIG. 1 shows a green film, printed with electrode material, in plan view. The printing is carried out in accordance with a pattern, wherein printed areas 1 and unprinted areas 2 remaining free. The section lines SL in this case indicate the subsequent division of the large-area green films into smaller composites having the desired actuator area. Shown in FIG. 1 is one green film with a pattern of 3×3 smaller composites. Depending on the desired base area for the subsequent piezoelectric actuator, any other desired pattern and/or another electrode pattern 1, 2 is also conceivable. The quadratic pattern indicated by the section lines in FIG. 1 has, for example, an edge length of 14 mm.

For the electrode layer, sufficient electrode material is printed on one side for a coherent electrode layer of about 2 to 3 $\mu$m thickness to result after sintering.

Figure 2:
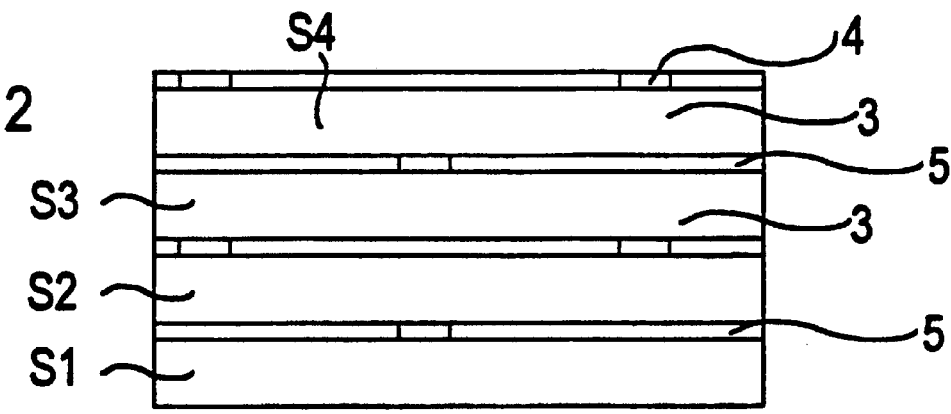
FIG. 2 shows a schematic cross-sectional view of a stack of printed green films.

Looking now at FIG. 2, the piezoceramic green films S1, S2, S3 . . . printed with electrode material are optionally dried and subsequently stacked on one another, wherein an alternating arrangement of piezoceramic layers 3 and electrode layers 5 results. In the case of the electrode layers, the stacking is likewise carried out alternately such that, above each of the cutouts 4, which correspond to the unprinted areas 2 of FIG. 1, in a first electrode layer there is arranged an area 1, printed with electrode material, in the next adjacent electrode layer. This is achieved, in the case of an electrode pattern as shown in FIG. 1, by means of a 180° rotation of the film about an axis perpendicular to the film. In FIG. 2, the alternating arrangement of the green films 3 printed with electrode material 5 in the stack is indicted schematically. As a result of the alternating arrangement, each second layer coincides in terms of its electrode pattern. In the layers lying in between, which likewise coincide with one another, the cutouts 4 are offset.

In this way, stacks are formed from as many individual layers, laid on one another, that an overall height of typically 2 to 3 mm is not exceeded. In the case of a green film thickness of, for example, 100 $\mu$m, this corresponds to about 30 individual layers.

The loosely stacked individual layers now have placed on them a punch, with which the stack is compressed under a uniaxial pressure of about 100 mPa in a quasi-isostatic manner. Even at room temperature, but preferably under a slightly elevated temperature and under atmospheric conditions, the flowability of the binder leads to an increase in the ceramic density of 48 to 60 percent of the theoretical ceramic density. At the same time, an internal pressure and volume equalization takes place wherein for example, the cutouts 4 in the electrode pattern are completely filled by ceramic material. In this way, even density and pressure gradients within the stack or the finished composite are equalized during the lamination.

Figure 3:
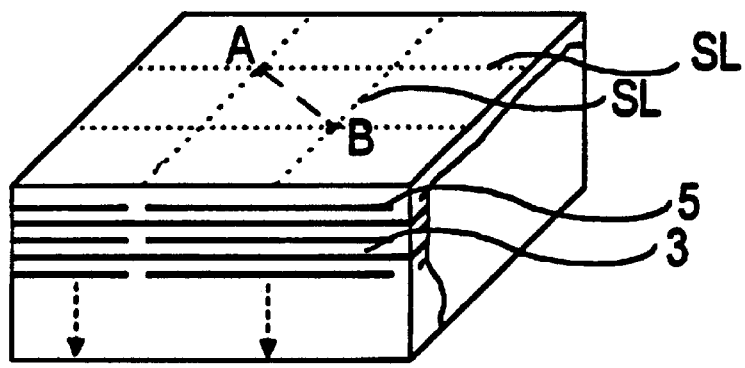
FIG. 3 shows a perspective view of this stack following lamination (=first composite).

FIG. 3 shows a composite produced in this way in a perspective representation. The original cutouts 4 are now completely filled with ceramic material 3. The solid composite made of the laminated individual layers still has sufficient plasticity so that it can be divided up in this stage, in accordance with the pattern predefined by the section lines, into the corresponding number of smaller composites having the desired base area. This can take place by means of cutting or stamping in a highly automated process. By using additionally printed-on cutting marks (not shown), the separation of the composite can be observed by means of a video process and can be monitored using a computer.

In the next step, the laminated stacks (composites) separated in this way are freed of binder. This takes place in a thermal step with a temperature increasing slowly up to about 500° C. An oxygen partial pressure rising in parallel therewith ensuring that the organic binder diffuses out and does not decompose abruptly and, in so doing, does not destroy the ceramic structure. The conditions are therefore set such that only in a later phase of the process does an oxidation of the binder or of its fragments produced by thermal decompositions take place. The low stack height of the composites of, for example, 3 mm ensures short diffusion paths for the decomposition products and/or oxidation products of the binder. In the exemplary embodiment, the binder removal is terminated within 24 hours at a temperature rising to 500° C. in an atmosphere containing a maximum of 8 percent by volume of oxygen. During the binder removal, no dimensional changes and therefore no warping in the stack is observed. The vertical structural accuracy in the composite is thus maintained.

Figure 4:
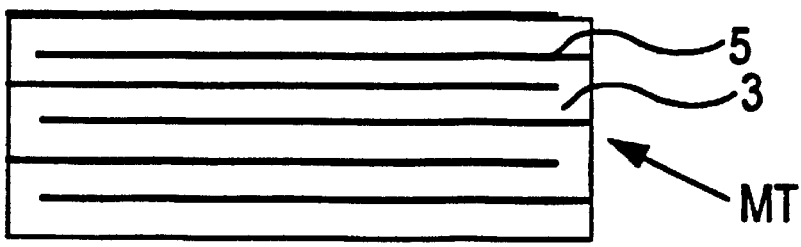
FIGS. 4 to 6 show variously constructed composites which correspond to different areas in the subsequent piezoelectric actuator. In each case, a section along the diagonal A–B of FIG. 3 is shown.
Figure 5:
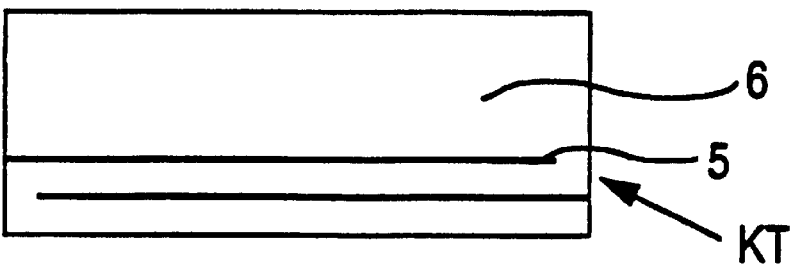
Figure 6:
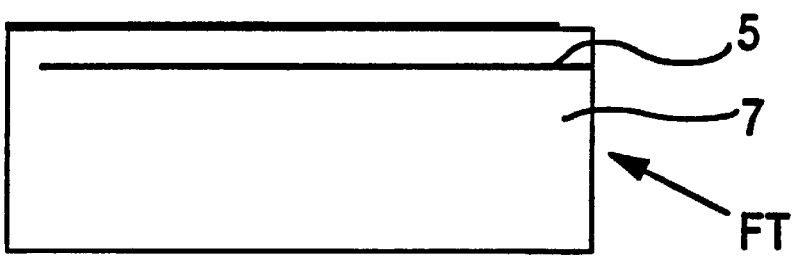

The piezoelectric actuator according to the present invention can be built up from a plurality of different composites. In the simplest case (for this, see also FIGS. 4 to 6), the piezoelectric actuator includes at least one middle part MT, which has the regular, alternating electrode structure already described. Provided at the upper end of the stack is a top part KT. The latter inlcudes a top plate 6 which contains either no active, that is to say electrically connected, electrode layer or even no electrode layer. A top plate 6 built up merely from ceramic films can be used for improved force transmission of the piezoelectric actuator. The bottom part FT, whose bottom plate 7 can be constructed like the top plate 6 of the top part KT, also has a corresponding structure.

In order to minimize the use of material, it is possible to vary the pattern for the printed-on electrode layers and to produce a complete piezoelectric actuator, including top part and bottom part and a corresponding number of middle parts, from a single laminated stack. The number of identically or differently constructed middle parts is, in this case, dependent on the level of the desired deflection of the finished piezoelectric actuator which, in turn, determines the height of the piezoelectric actuator.

Figure 7:
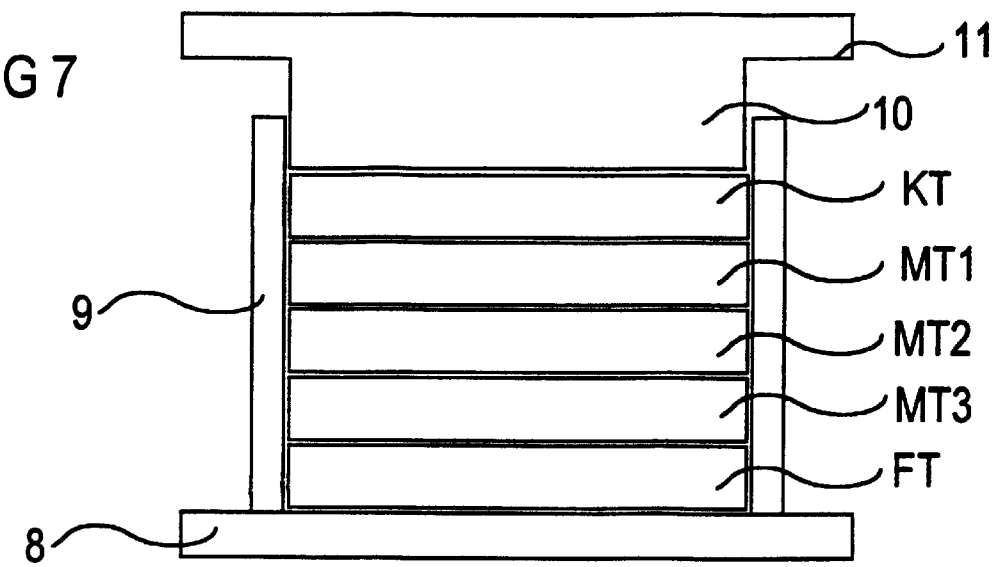
FIG. 7 shows the arrangement of various composites in a die.

FIG. 7 shows how the top, middle and bottom parts, from which the binder has been removed, are stacked up to the desired height in an accurately-fitting die 9, and are weighted down using a punch 10. The sintering then takes place under a light pressure of 10 to 100 kPa in an oxidizing atmosphere. The press die, which is round for example, corresponds in its diameter to the stamped dimension of the composites stacked on one another. The die and punch are preferably reusable and composed of materials which do not enter into any reactions with the ceramic during the sintering. Well-suited for this are, for example, dies made of aluminium oxide or magnesium oxide. The pressure can be produced in a simple way using an additional weight placed on the punch. It is also true for the material of this additional weight that it is stable at 1130° C. in an oxidizing atmosphere and, for its part, does not have a damaging influence on the sintering atmosphere.

For the purpose of sintering, once more a temperature program is run until the maximum sintering temperature is reached. This may take place in an individual furnace with temperature monitoring or in a continuous furnace with appropriately differently temperature-controlled zones. In the exemplary embodiment, the sintering is completed after about 24 hours at 1130° C.

As a result, a monolithic piezoelectric actuator is obtained which has an optimally pronounced ceramic structure, good piezoelectric properties because of the higher sintering temperature and a high composite strength between the ceramic layers and the electrode layers. Accordingly, the monolithic piezoelectric actuator also possesses a high degree of stiffness, with which the transmission of high forces is possible.

Figure 8:
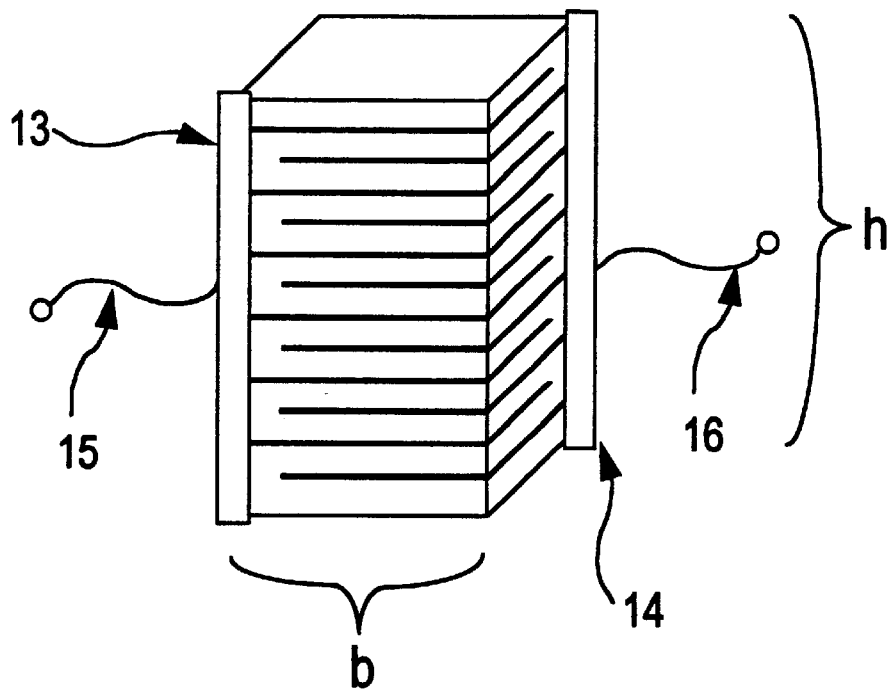
FIG. 8 shows a finished piezoelectric actuator provided with electric connections.

FIG. 8 shows a finished piezoelectric actuator to which, for the purpose of making electrical contact, contact is made with electrode material in a strip shape at mutually opposite corners. Because of the electrode structure which alternates from individual layer to individual layer, such a contact 13 only reaches each second electrode layer in each case, while the contact 14 fastened to the opposite edge makes contact with the electrode layers lying in between in each case. Electrically parallel wiring of the piezoelectric layers (lying between the electrode layers) is thus possible, which allows optimum operation of the piezoelectric actuator.

The aspect ratio, determined from the ratio of the height h to the edge length b, can assume a value of up to 5 in the case of the piezoelectric actuator according to the present invention. In principle, it is also possible to produce still higher and slimmer piezoelectric actuators, but this entails an increased failure rate during sintering. The die is matched in its internal dimensions to the stamped dimension or the dimension of the composites from which the binder has been removed. However, since during sintering a linear shrinkage in all three spatial axes of about 15 percent is observed, the die is able to support the stack only at the beginning of the sintering process. During the further progress of the sintering process, it is therefore possible for bending over of the stack to occur in the case of excessively high or excessively slim piezoelectric actuators.

In the case of the piezoelectric actuator according to the present invention, it should be mentioned as especially advantageous that the vertical structural accuracy of the electrodes in the area of the contact edges is independent of the aspect ratio. Because of tolerances and slight deviations during stamping and stacking, although it is possible in the case of two successive middle parts for slight offsets, of the electrode structures to occur (such being characteristic of the process), these are of no importance for the reliability of making contact.

Although the present invention has been described with reference to specific embodiments, those of skill in the art will recognize that changes may be made thereto without departing from the spirit and scope of the invention as set forth in the hereafter appended claims.

What is claimed is:

1. A method for producing a piezoelectric actuator of monolithic multilayer design, comprising the steps of:

providing a plurality of piezoceramic green films, each green film containing a binder and having a thickness of 20 to 200 μm;

printing a layer of electrode material on one side of each of the green films;

layering the green films loosely on one another to form a plurality of first stacks, each first stack having a 3 mm maximum height and having an alternating layered sequence of green films and electrode material;

laminating the first stacks using uniaxial compression to form a corresponding plurality of first composites;

removing the binder from the first composites at an elevated temperature;

stacking the first composites from which the binder has been removed on one another to form a plurality of first composite stacks, each first composite stack having a height of more than 5 mm;

sintering a first composite stack under uniaxial pressure to form a piezoelectric actuator having a desired number of individual layers, said sintering step taking place while applying pressure to said first composite stack with a press die;

selectively providing piezoceramic green films of n times a desired base area as part of the step of providing a plurality of piezoceramic green films, n being a positive whole number greater than one; and dividing up, by at least one of cutting and stamping, a first composite into said n composites of a desired base area before the step of removing the binder.

2. A method as claimed in claim 1, wherein the step of stacking takes place in said press die.

3. A method as claimed in claim 1, wherein the green films include lead zirconate titanate (PZT) and the step of sintering takes place in an oxidizing atmosphere.

4. A method as claimed in claim 1, wherein the step of sintering takes place under constant pressure of 10 to 100 kPa.

5. A method as claimed in claim 1, wherein the piezoelectric actuator is formed from one of said first composite stacks which is, in turn, formed of differing composites which include a top composite, a middle composite and a bottom composite.

6. A method as claimed in claim 1, wherein the piezoelectric actuator is formed from a composite stack which is, in turn, formed from a plurality of composites, at least one of said composites having an electrode structure which is different from an electrode structure of other ones of said composites.

7. A method as claimed in claim 1, wherein the electrode material is a paste which contains silver and palladium.

* * * * *